United States Patent
Govind et al.

(10) Patent No.: US 6,759,921 B1
(45) Date of Patent: Jul. 6, 2004

(54) CHARACTERISTIC IMPEDANCE EQUALIZER AND AN INTEGRATED CIRCUIT PACKAGE EMPLOYING THE SAME

(75) Inventors: Anand Govind, Fremont, CA (US); Yogendra Ranade, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 17 days.

(21) Appl. No.: 09/932,716

(22) Filed: Aug. 17, 2001

(51) Int. Cl.⁷ .................................................. H03H 7/38
(52) U.S. Cl. ......................... 333/34; 333/246; 257/692
(58) Field of Search ........................... 333/33, 34, 246; 257/712, 713, 728, 692; 361/777, 774

(56) References Cited

U.S. PATENT DOCUMENTS

| | | | |
|---|---|---|---|
| 5,184,095 A | * 2/1993 | Hanz et al. ................... 333/33 |
| 6,154,103 A | * 11/2000 | Scharen et al. ........... 333/99 S |
| 6,424,027 B1 | * 7/2002 | Lamson et al. ............. 257/676 |
| 6,459,049 B1 | * 10/2002 | Miller et al. ................ 174/261 |
| 6,518,663 B1 | * 2/2003 | James et al. ................ 257/734 |

* cited by examiner

*Primary Examiner*—Robert Pascal
*Assistant Examiner*—Stephen E. Jones
(74) *Attorney, Agent, or Firm*—Hitt Gaines, P.C.

(57) ABSTRACT

The present invention provides a characteristic impedance equalizer and method of manufacture thereof for use with an integrated circuit package having first and second signal transmission zones. In one embodiment, the characteristic impedancs equalizer includes a first conductor having a first width and providing a characteristic impedance within the first signal transmission zone. The characteristic impedance equalizer also includes a second conductor, coupled to the first conductor, having a second width and providing substantially the same characteristic impedance within the second signal transmission zone.

18 Claims, 4 Drawing Sheets

US 6,759,921 B1

CHARACTERISTIC IMPEDANCE EQUALIZER AND AN INTEGRATED CIRCUIT PACKAGE EMPLOYING THE SAME

TECHNICAL FIELD OF THE INVENTION

The present invention is directed, in general, to integrated circuit packaging and, more specifically, to a characteristic impedance equalizer and an integrated circuit package employing the same.

BACKGROUND OF THE INVENTION

Reliable operation of electronic devices, especially semiconductor devices, is of a primary importance today. Often the success of a company may depend on the success at which new technology is reliably established, especially in a developing market. Particularly challenging is the general market demand for devices that perform more functions at increasingly faster operating speeds. This demand for increased functionality usually drives the device design toward more complexity, which typically involves higher component densities. Higher densities alone complicate the environment for signal transmissions within the device. The demand for faster signal speeds further exacerbates this condition causing the environments and associated designs that were acceptable at slower signal speeds to cross into the realm of unacceptability.

Signal environments that exist in a semiconductor die may require special attention to insure that the ever closer proximity of signals will not generate cross-talk or other interference conditions. Although challenging, these on-chip detrimental conditions may be overcome through appropriate layout and shielding designs. High speed, high density packaging substrate design, however, typically involves a constant trade-off between cost and electrical signal integrity requirements. To reduce costs, signals are often routed in a microstrip construction where the signal only references one power or ground plane.

Additionally, the construction of a flip chip package, for example, employs a copper stiffener to reduce warpage and a copper heatsink or slug to dissipate heat from the back of the semiconductor die. When a four-layer flip chip packaging substrate is used in this assembly configuration, the traces routed on the top layer are subject to several discontinuities in the electrical environment. One source of discontinuity is the microstrip trace routing from the central cavity area formed under the heatsink and the region under the stiffener. These discontinuities lead to a variation in the characteristic impedance associated with the microstrip traces. This causes reflected noise and losses during signal transmission.

The discontinuity could be eliminated by using a strip line construction wherein the signal is sandwiched between power and ground planes for its entire length. However, this would need additional layers in the packaging substrate thereby increasing the cost. Another approach is to shrink the stiffener opening to bring it closer to an edge of the semiconductor die thereby providing a more uniform and controlled electrical environment for the microstrip traces on the top layer of the packaging substrate. However, this means different stiffener openings for every semiconductor die size. The resultant non-standardization in stiffener opening complicates the overall assembly process and thereby also increase assembly costs.

Accordingly, what is needed in the art is a way to provide a more controlled characteristic impedance that is both robust and cost effective in an integrated circuit package.

SUMMARY OF THE INVENTION

To address the above-discussed deficiencies of the prior art, the present invention provides a characteristic impedance equalizer for use with an integrated circuit package having first and second signal transmission zones. In one embodiment, the characteristic impedance equalizer includes a first conductor having a first width and providing a characteristic impedance within the first signal transmission zone. The characteristic impedance equalizer also includes a second conductor, coupled to the first conductor, having a second width and providing substantially the same characteristic impedance within the second signal transmission zone.

In another aspect, the present invention provides a method of manufacturing an integrated circuit package. The method of manufacturing includes providing a substrate configured to be partitioned into first and second signal transmission zones. The method further includes forming a first conductor having a first width and providing a characteristic impedance within the first signal transmission zone and forming a second conductor having a second width and providing substantially the same characteristic impedance within the second signal transmission zone.

In yet another aspect, the present invention provides an integrated circuit package that includes a substrate configured to be partitioned into first and second signal transmission zones. The integrated circuit package also includes a characteristic impedance equalizer with a first conductor having a first width providing a characteristic impedance within the first signal transmission zone and a second conductor having a second width providing substantially the same characteristic impedance within the second signal transmission zone.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
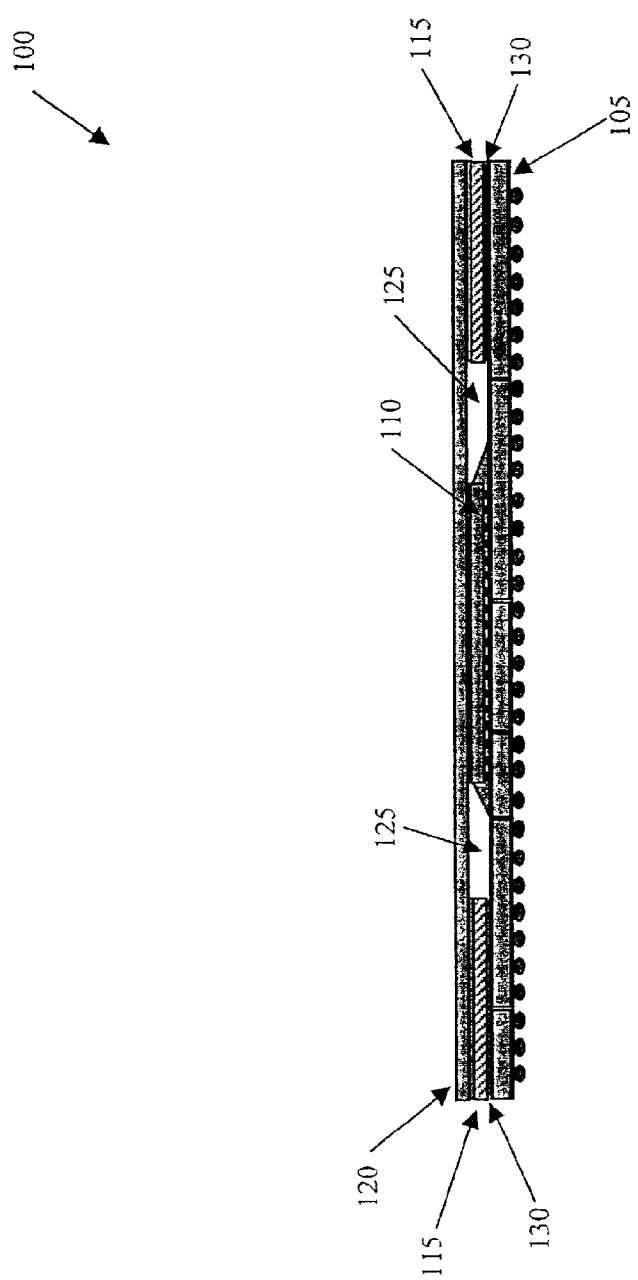
FIG. 1 illustrates a side view of an embodiment of an integrated circuit package, constructed in accordance with the principles of the present invention.

Referring initially to FIG. 1, illustrated is a side view of an embodiment of an integrated circuit package, generally designated 100, constructed in accordance with the principles of the present invention. The integrated circuit package 100 includes a four-layer, flip chip substrate 105, an integrated circuit die 110, a metallic stiffener 115, a metallic heatspreader 120, a first signal transmission zone 125 and a second signal transmission zone 130.

The integrated circuit die 110 is positioned in the central area of the integrated circuit package 100 and is electrically coupled to the four-layer, flip chip substrate 105. Further, the integrated circuit die 110 is mechanically coupled between the four-layer, flip chip substrate 105 and the metallic heatspreader 120. In the illustrated embodiment, both the metallic stiffener 115 and the metallic heatspreader 120 are constructed of copper, which has an appropriate stiffness and provides good heat conductivity.

The metallic stiffener 115 is approximately square in cross-sectional area and formed of a single sheet of copper that has a square portion of its center section removed. The integrated circuit die 110 is placed in the center of this removed area, as shown. Both the integrated circuit die 110 and the metallic stiffener 115 are bonded between the four-layer, flip chip substrate 105 and the metallic heatspreader 120. The metallic stiffener 115 and the metallic heatspreader 120 cooperate to stiffen the overall package and remove the heat generated by the integrated circuit die 110.

This packaging regime produces the first and second signal transmission zones 125, 130. The first transmission zone 125 occurs between the four-layer, flip chip substrate 105 and the metallic heatspreader 120, and the second signal transmission zone 130 occurs between the four-layer, flip chip substrate 105 and the metallic stiffener 115. The first and second signal transmission zones 125, 130 create different signal transmission environments and properties due to the different nature of their respective proximity to the surface of the four-layer, flip chip substrate 105. In particular, the first and second signal transmission zones 125, 130 typically have different characteristic impedances for a conductor having a uniform width on the surface of the four-layer, flip chip substrate 105.

An embodiment of a method of manufacturing the integrated circuit package 100 includes providing the substrate 105 configured to be partitioned into first and second signal transmission zones 125, 130. A first conductor having a first width and providing a characteristic impedance within the first signal transmission zone 125 and a second conductor having a second width and providing substantially the same characteristic impedance within the second signal transmission zone 130 are formed on the substrate 105. A junction (see FIG. 4) between the first conductor and the second conductor is formed having a semi-circular cross-sectional area wherein the first width is greater than the second width. A plurality of the first and second conductors having appropriate junctions are formed on the substrate 105. Each of the first and second conductors provides a transmission path for a signal transmission.

The metallic stiffener 115 is positioned over a portion of the substrate 105 containing the second conductors to form the second signal transmission zone 130. The metallic heatspreader 120 is positioned over a portion of the substrate 105 containing the first conductors to form the first signal transmission zone 125 and over the metallic stiffener 115.

As will be discussed in more detail with respect to FIG. 2, the top layer of the four-layer, flip chip substrate 105 may contain a plurality of conductors. These conductors traverse the first and second signal transmission zones 125, 130 and provide a plurality of signal transmission paths. In the illustrated embodiment, the four-layer, flip chip substrate 105 is configured to be partitioned into the first and second signal transmission zones 125, 130. A characteristic impedance equalizer is employed in each of the conductors. Of course, an alternative embodiment of the present invention may employ an integrated circuit package having more than two signal transmission zones. Such an embodiment includes a characteristic impedance equalizer associated with each of the conductors that appropriately accommodates each signal transmission zone.

Figure 2:
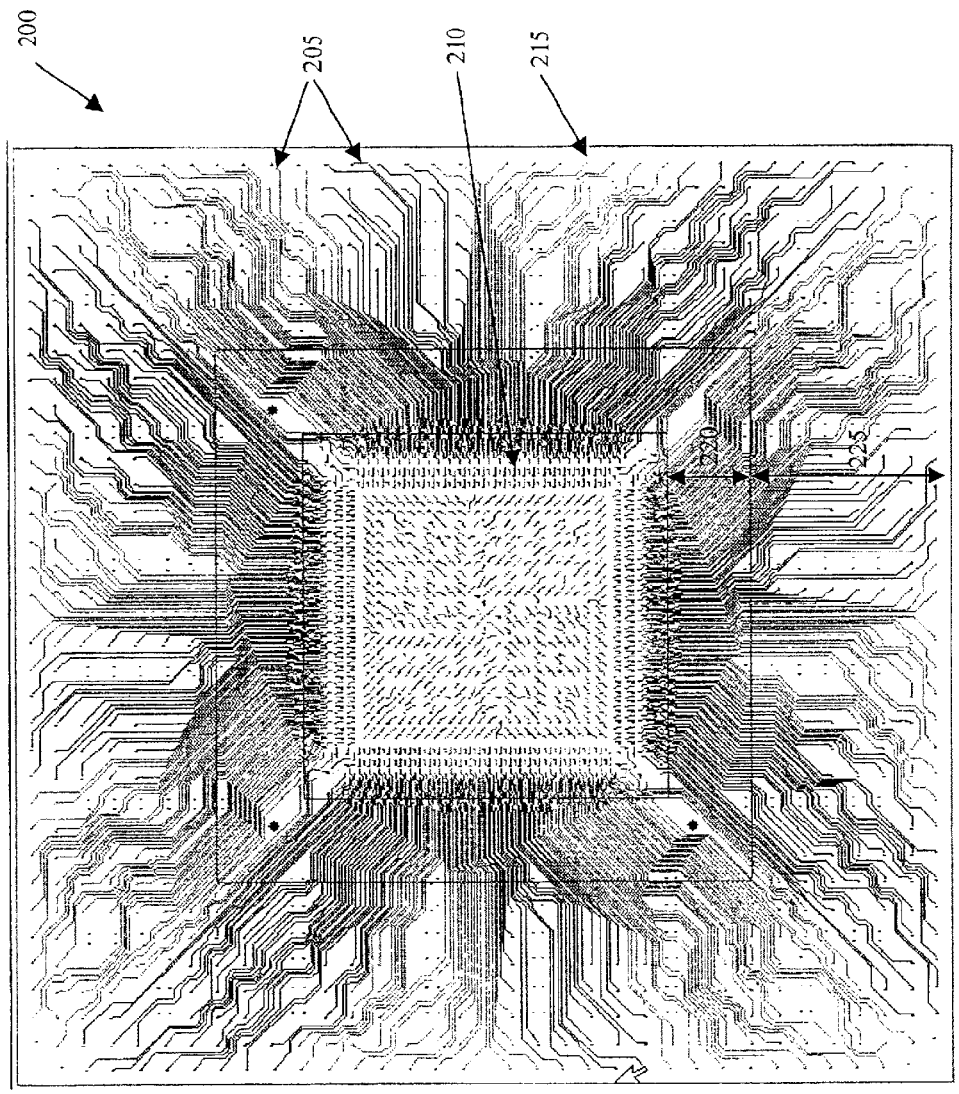
FIG. 2 illustrates a plan view of an embodiment of portions of an integrated circuit package including a substrate showing a surface portion that is proximate a metallic heatspreader and a metallic stiffener, constructed in accordance with the principles of the present invention.

Turning now to FIG. 2, illustrated is a plan view of an embodiment of portions of an integrated circuit package including a substrate, generally designated 200, showing a surface portion that is proximate a metallic heatspreader and a metallic stiffener, constructed in accordance with the principles of the present invention. The substrate 200 may be representative of the four-layer, flip chip substrate 105 as discussed with respect to FIG. 1. The substrate 200 accommodates a plurality of conductors, collectively designated 205, that support a plurality of signal transmissions between a centrally-located integrated circuit die 210 and an outside perimeter 215 of the substrate 200. The substrate 200 also accommodates first and second signal transmission zones 220, 225.

Similar to FIG. 1, the first signal transmission zone 220 is provided between a portion of the substrate 200 containing a plurality of first conductors that are proximate the metallic heatspreader. The second signal transmission zone 225 is provided between a portion of the substrate 200 containing a plurality of second conductors that are proximate the metallic stiffener. In the illustrated embodiment, the respective thicknesses of the first and second conductors are essentially equal and configured to be much less than their respective first and second widths. In the illustrated embodiment, the first width is greater than the second width as will be further discussed with respect to FIG. 3 below.

Each of the plurality of conductor transmission paths 205 employs a characteristic impedance equalizer that substantially matches a characteristic impedance between the first and second signal transmission zones 220, 225. The characteristic impedance equalizer includes the first conductor having the wider first width, which provides a characteristic impedance within the first signal transmission zone 220. The characteristic impedance equalizer also includes the second conductor, coupled to the first conductor and having the narrower second width, which provides substantially the same characteristic impedance within the second signal transmission zone 225.

Figure 3:
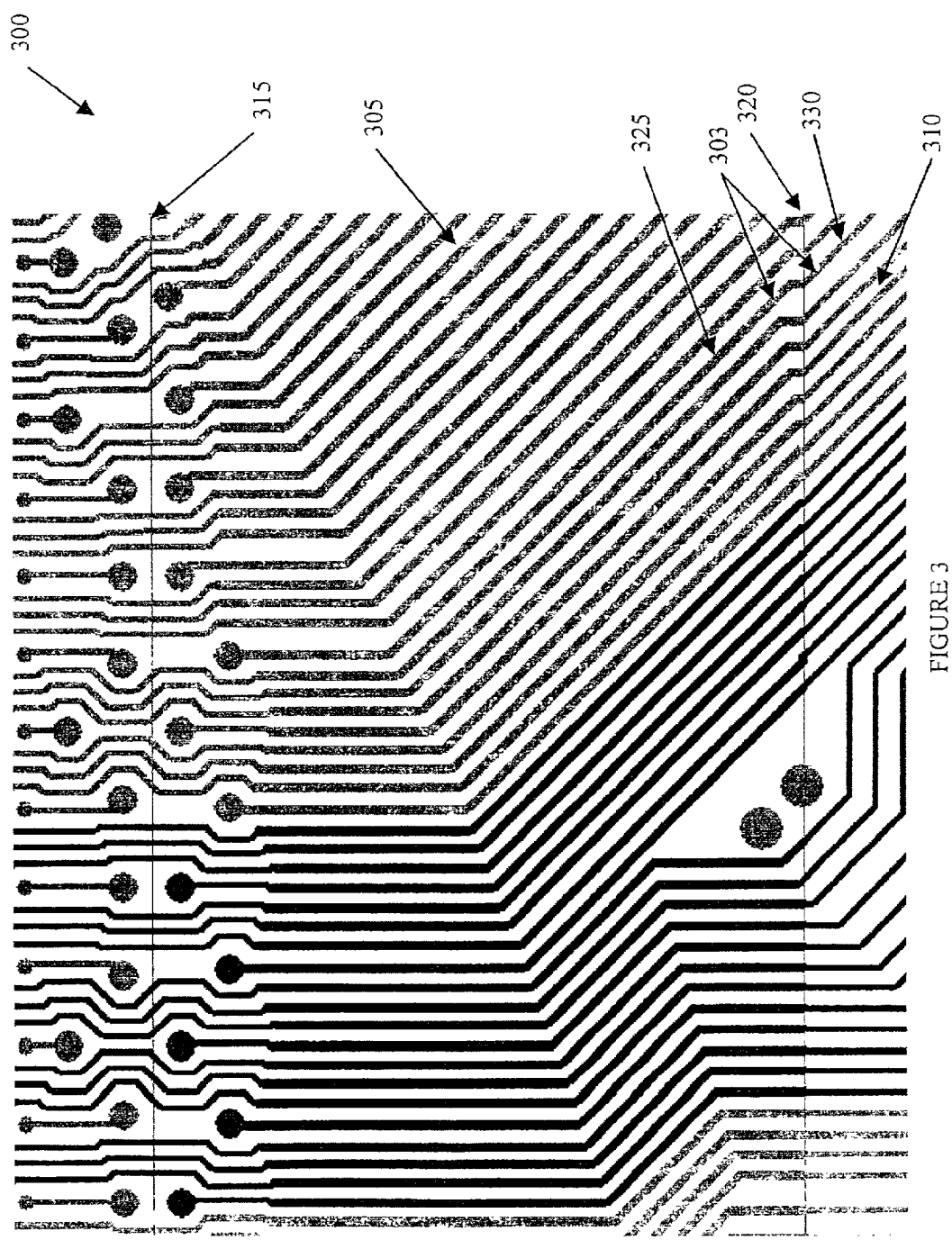
FIG. 3 illustrates a plan view of an embodiment of a portion of a substrate showing a plurality of conductors forming a portion of characteristic impedance equalizers, constructed in accordance with the principles of the present invention.

Turning now to FIG. 3, illustrated is a plan view of an embodiment of a portion of a substrate, generally designated 300, showing a plurality of conductors forming a portion of characteristic impedance equalizers constructed in accordance with the principles of the present invention. The substrate 300 is partitioned into a first signal transmission zone 305 located approximately between an integrated circuit die boundary 315 and a metallic stiffener boundary 320. The substrate 300 is also partitioned into a second signal transmission zone 310 located approximately between the metallic stiffener boundary 320 and an outside perimeter of the substrate 300, which is not shown in FIG. 3.

As may be seen in the embodiment of FIG. 3, a characteristic impedance equalizer 303, which is typical of those employed in each of the plurality of conductors, transitions between a wider-width trace 325 and a narrower-width trace 330 in the vicinity of the metallic stiffener boundary 320. The wider-width trace 325 is located in the first signal transmission zone 305 to achieve a required characteristic impedance for signals traversing this portion of an overall transmission path between an integrated circuit die and a perimeter of the substrate 300. Similarly, the narrower-width trace 330 is located in the second signal transmission zone 310 to achieve substantially the same characteristic impedance of the first signal transmission zone 305.

The wider-width trace 325 is about 40 percent wider than the narrower-width trace 330, in the illustrated embodiment. This value was determined from experimentation and simulation to provide a characteristic impedance equalizer that performs satisfactorily in achieving substantially the same characteristic impedance in the first and second signal transmission zones 305, 310. In the illustrated embodiment, all of the wider-width traces are of approximately equal widths. Similarly, all of the narrower-width traces are of approximately equal widths, as well.

In alternative embodiments of the present invention, the wider-width traces may employ more than one width, as may the narrower-width traces, to achieve a required characteristic impedance in different signal transmission zones. Additionally, a characteristic impedance equalizer may also employ more than the two trace widths of the illustrated embodiment to substantially maintain a characteristic impedance wherein two or more signal transmission zones are encountered.

Figure 4:
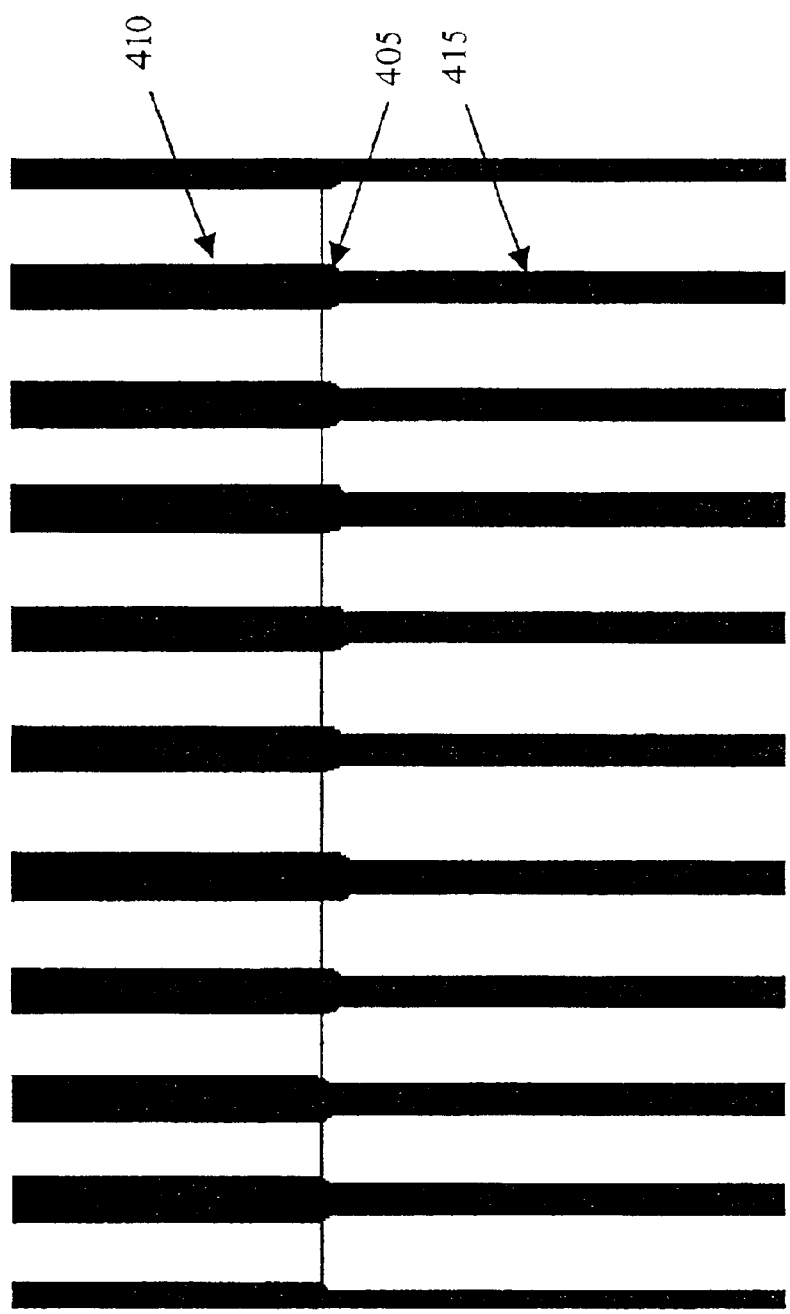
FIG. 4 illustrates a plan view of an embodiment of a portion of a plurality of characteristic impedance equalizers showing a conductor transition area between two signal transmission zones, constructed in accordance with the principles of the present invention.

Turning now to FIG. 4, illustrated is a plan view of an embodiment of a portion of a plurality of characteristic impedance equalizers showing a conductor transition area between two signal transmission zones, constructed in accordance with the principles of the present invention. The conductor transition area includes a plurality of junctions, wherein a junction 405 is representative, between a first conductor 410 and a second conductor 415. In the illustrated embodiment, the junction 405 has a semi-circular cross-sectional area as it transitions from the first conductor 410 to the second conductor 415. Alternatively, other embodiments of the junction 405 may employ other shapes or configurations that enhance an appropriate transition between the two signal transmission zones to maintain a substantially constant overall characteristic impedance.

In summary, several embodiments of a characteristic impedance equalizer for use with an integrated circuit package have been presented. Each of these embodiments of the present invention maintains the characteristic impedance at a substantially constant value for a transmission signal that traverses at least two different signal transmission zones. Maintaining a substantially constant characteristic impedance significantly reduces reflective signal energy along a transmission path and also reduces crosstalk energy between different transmission paths thereby enhancing overall performance.

Although the present invention has been described in detail, those skilled in the art should understand that they can make various changes, substitutions and alterations herein without departing from the spirit and scope of the invention in its broadest form.

What is claimed is:

1. For use with an integrated circuit package having first and second signal transmission zones, a characteristic impedance equalizer, comprising:
    a first conductor having a first width and providing a characteristic impedance within said first signal transmission zone; and
    a second conductor, coupled to said first conductor employing a junction therebetween with a semi-circular cross-sectional area, having a second width and providing substantially said characteristic impedance within said second signal transmission zone.

2. The characteristic impedance equalizer as recited in claim 1 further comprising a plurality of said first and second conductors coupled to a substrate.

3. The characteristic impedance equalizer as recited in claim 1 wherein said first signal transmission zone is provided between a portion of said substrate containing said first conductor and a metallic heatspreader.

4. The characteristic impedance equalizer as recited in claim 1 wherein said second signal transmission zone is provided between a portion of said substrate containing said second conductor and a metallic stiffener.

5. The characteristic impedance equalizer as recited in claim 1 wherein said first width is greater than said second width.

6. The characteristic impedance equalizer as recited in claim 1 wherein said first and second conductors provide a transmission path for a signal transmission.

7. A method of manufacturing an integrated circuit package, comprising:
    providing a substrate configured to be partitioned into first and second signal transmission zones;
    forming a first conductor having a first width and providing a characteristic impedance within said first signal transmission zone;
    forming a second conductor having a second width and providing substantially said characteristic impedance within said second signal transmission zone; and
    forming a junction between said first conductor an said second conductor having a semi-circular cross-sectional area.

8. The method of manufacturing as recited in claim 7 wherein said first and second conductors provide a transmission path for a signal transmission.

9. The method of manufacturing as recited in claim 7 further comprising forming a plurality of said first and second conductors.

10. The method of manufacturing as recited in claim 7 further comprising positioning a metallic heatspreader over a portion of said substrate containing said first conductor and forming said first signal transmission zone.

11. The method of manufacturing as recited in claim 7 further comprising positioning a metallic stiffener over a portion of said substrate containing said second conductor and forming said second signal transmission zone.

12. The method of manufacturing as recited in claim 7 wherein said first width is greater than said second width.

13. An integrated circuit package, comprising:
    a substrate configured to be partitioned into first and second signal transmission zones; and
    a characteristic impedance equalizer, including:
        a first conductor having a first width providing a characteristic impedance within said first signal transmission zone, and a second conductor having a second width providing substantially said characteristic impedance within said second signal transmission zone, wherein a junction between said first conductor and said second conductor has a semi-circular cross-sectional area.

14. The integrated circuit package as recited in claim 13 wherein said first and second conductors provide a transmission path for a signal transmission.

15. The integrated circuit package as recited in claim 13 wherein said first width is greater than said second width.

16. The integrated circuit package as recited in claim 13 wherein said characteristic impedance equalizer contains a plurality of said first and second conductors.

17. The integrated circuit package as recited in claim 13 further comprising a metallic heatspreader and said first signal transmission zone is provided between a portion of said substrate containing said fist conductor and said metallic heatspreader.

18. The integrated circuit package as recited in claim 13 further comprising a metallic stiffener and said second signal transmission zone is provided between a portion of said substrate containing said second conductor and said metallic stiffener.

* * * * *